United States Patent [19]

Naganuma et al.

[11] Patent Number: 4,825,107
[45] Date of Patent: Apr. 25, 1989

[54] MASTER SLICE TYPE INTEGRATED CIRCUIT

[75] Inventors: Masayuki Naganuma; Yoshiyuki Suehiro, both of Kawasaki, Japan

[73] Assignee: Fujitsu Limited, Kawasaki, Japan

[21] Appl. No.: 155,574

[22] Filed: Feb. 12, 1988

[30] Foreign Application Priority Data

Feb. 13, 1987 [JP] Japan ................. 62-31782

[51] Int. Cl.⁴ ............. H03K 3/01; H03K 19/01; H03K 17/04; H01L 27/00
[52] U.S. Cl. ................. 307/465; 307/303.1; 357/45; 364/716; 364/491
[58] Field of Search ........... 307/243, 465, 466, 467, 307/468, 469, 475, 296 R, 303; 340/825.02, 825.43; 364/716, 491; 357/45

[56] References Cited

U.S. PATENT DOCUMENTS

| 4,670,749 | 2/1987 | Freeman | 307/465 X |
| 4,697,095 | 9/1987 | Fujii | 307/465 X |
| 4,725,835 | 2/1988 | Schreiner et al. | 307/465 X |
| 4,727,268 | 2/1988 | Hori | 307/465 |
| 4,734,885 | 3/1988 | Luich | 307/465 X |

Primary Examiner—Stanley D. Miller
Assistant Examiner—David R. Bertelson
Attorney, Agent, or Firm—Staas & Halsey

[57] ABSTRACT

A master slice type integrated circuit for providing various circuits by altering the routing of interconnections comprises a plurality of input/output cells arranged in a peripheral region on a semiconductor chip, the input/output cells each comprising pads for connection with an external circuit, input wiring regions each for accommodating input interconnecting lines transmitting input signals applied to the pads, and output circuit regions each for forming output buffers; and a plurality of basic cells being arranged in a region on the chip surrounded by the arrangement of the input/output cells. Two adjacent input/output cells are paired with each other. The output circuit regions of the pair of the input/output cells are arranged in the vicinity of a boundary of the pair. The input wiring regions of the pair are arranged in the vicinity of boundaries with respect to other pairs.

13 Claims, 3 Drawing Sheets

MASTER SLICE TYPE INTEGRATED CIRCUIT

BACKGROUND OF THE INVENTION

The present invention generally relates to master slice type integrated circuits, and in particular to improvements in input/output cells formed in a peripheral region on a semiconductor chip of a master slice type integrated circuit.

A master slice type integrated circuit has been widely researched and manufactured. A complementary metal oxide semiconductor (CMOS) gate array is an example of applications of the master slice type integrated circuit. The master slice type integrated circuit comprises a semiconductor chip on which there are formed basic cells arrayed like a matrix and input/output cells arranged in a peripheral region on the chip outside a region in which the basic cell matrix is formed. Each basic cell is generally constituted by a plurality of transistors. Pre-processing for forming transistors is commonly carried out. At an interconnecting step which is a last step of steps for producing the master slice type integrated circuit, arbitrary routing of interconnection lines may be selected. Therefore, desired logic circuits can be constituted by interconnecting the basic cells and I/O cells in accordance with user's requests.

The input/output cells (hereafter simply referred to as I/O cells) are used to provide the logic circuits on the chip with signals which are provided by an external circuit and feed output signals of the logic circuits to the external circuit. Each of the I/O cells comprises an input wiring region through which an input interconnecting line extending towards the basic cell matrix is passed, an input protecting circuit region for forming an input protecting circuit for protecting an input buffer provided in the basic cell matrix against electrostatic discharge, an output circuit region for constituting an output buffer, and a bonding pad for connecting the input or output buffers to a terminal for the connection to the external circuit. Both the input wiring region and the input protecting circuit region form an input circuit region. As described before, these elements for constituting the I/O cell are arranged in the peripheral region on the chip. An interconnection to build circuits of the I/O cell may be also arbitrarily made in accordance with a user's specification. Generally, the interconnection between the I/O cell circuits is made by use of a first (lower) layer metallization deposited on an insulator on a silicon crystal of the chip. In the peripheral region of the chip, there is also provided a power supply line for providing the logic circuits constituted by the combination of the basic cells with the power. The power supply line is formed by a second (upper) metallization which is deposited on an insulator coated on the first metallization.

However, the conventional master slice type integrated circuit has the following disadvantages. All of the I/O cells have the same configuration to facilitate the automatic routing design of the interconnections. That is, the input wiring region, the output circuit region, and the input protecting circuit region of all I/O cell are respectively the same as those of other I/O cells from the view point of size, position and so on. The fact that all the I/O cells have the same configuration degrades the efficiency in utilizing the I/O cells, i.e., reduces the number of utilizable I/O cells. This means that the degree of flexibility of the design is not sufficient to satisfy the user's requests.

SUMMARY OF THE INVENTION

Accordingly, a general object of the present invention is to provide a novel and useful master slice type integrated circuit in which the disadvantages of the conventional master slice type integrated circuit have been eliminated.

A more specific object of the present invention is to provide a master slice type integrated circuit in which the routing of interconnections between regions formed in the I/O cell can be efficiently made.

Another object of the present invention is to provide a master slice type integrated circuit in which the efficiency in utilizing the I/O cells is improved.

Still another object of the present invention is to provide a master slice type integrated circuit in which the degree of freedom of the design by the user is improved.

The above objects of the present invention can be achieved by the master slice type integrated circuit for providing various circuits by altering the routing of interconnections, comprising a plurality of input/output cells arranged in a peripheral region on a semiconductor chip, the input/output cells each comprising pads for connection with an external circuit, input wiring regions each for accommodating input interconnecting lines carrying an input signal, and output circuit regions each for forming output buffers; and a plurality of basic cells being arranged in a region on the chip surrounded by the arrangement of the input/output cells. Two adjacent input/output cells are paired with each other. The output circuit regions of the pair of the input/output cells are arranged in the vicinity of a boundary of the pair. The input wiring regions of the pair are arranged in the vicinity of boundaries with respect to other pairs.

Other objects, features and advantages of the present invention will become apparent from the following detailed description when read in conjunction with the accompanying drawings.

DETAILED DESCRIPTION

To facilitate the understanding of the present invention, a description will be given on a conventional master slice type integrated circuit with reference to FIG. 1.

Figure 1:
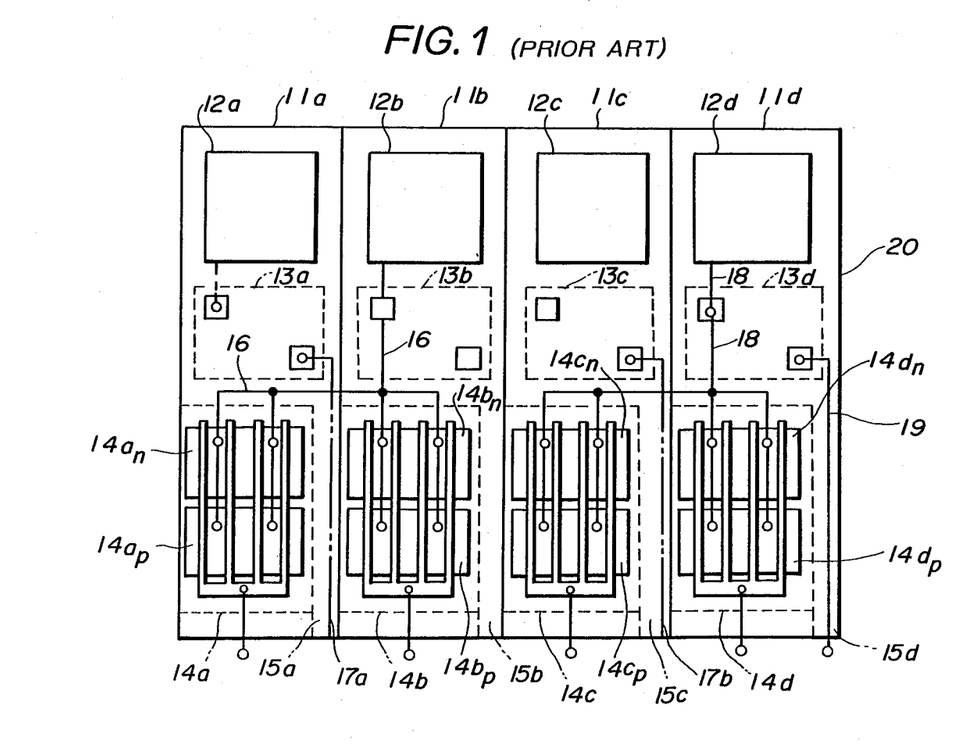
FIG. 1 is a plan view of essential parts of input/output cells of a conventional master slice type integrated circuit.

Referring to FIG. 1, I/O cells 11a, 11b, 11c and 11d are arranged in a peripheral region on a semiconductor chip 20 of a conventional master slice type integrated circuit. The I/O cells 11a, 11b, 11c and 11d respectively comprise pads 12a, 12b, 12c and 12d, input protecting circuit regions 13a, 13b, 13c and 13d, output circuit regions 14a, 14b, 14c and 14d, and input wiring regions 15a, 15b, 15c and 15d. An input circuit region is formed by the input protecting circuit region and the input wiring region. The pads 12a to 12d are aligned in the vicinity of a peripheral end. The input protecting circuit regions 13a to 13d for forming input protecting circuits are located between the pads 12a to 12d and the output circuit regions 14a to 14d, respectively. The input protecting circuits have a function of preventing an input buffer constituted by the basic cells from being damaged because of the electrostatic discharge. The output circuit regions 14a to 14d includes n-channel metal oxide semiconductor (MOS) regions $14a_n$ to $14d_n$ and p-channel MOS transistor regions $14a_p$ and $14d_p$, respectively. The n-channel regions $14a_n$ to $14d_n$ and the p-channel regions $14a_p$ and $14d_p$ comprises n+-diffused layers and p+-diffused layers formed in an n-type well layer, when the chip 20 is made of a p-type silicon substrate, for example. The output circuit regions 14a to 14d are used to form output buffers. The input wiring regions 15a to 15d of the input circuit regions are used to pass interconnecting lines extending from the pad or the input protecting circuit towards the input buffers.

As seen from FIG. 1, all of the I/O cells 11a to 11d have the same configuration as one another in order to facilitate the automatic routing design of interconnections between the elements of I/O cells to produce a desired device. In other words, the size and position of the elements forming the I/O cells are identical in all the I/O cells. The interconnections between the elements of the I/O cells are made by a first layer metallization, and a power supply line is made by a second layer metallization. That is, the I/O cells 11a to 11d have a bilayer interconnecting 25 structure.

In the example illustrated, the pad 12b and the output circuit regions 14a and 14b are mutually connected to each other by an interconnecting line 16 at the first metallization level (i.e., lower level). Hence, the combination of the I/O cells 11a and 11b makes an output buffer having a driving capability twice that of an output buffer constituted by a single output circuit region. However, the interconnecting line 16 makes it impossible to select the routing of an interconnecting line 17a shown by a two-dotted chain line which extends from the input protecting circuit region 13a and is passed through the input wiring region 15a. This is because the interconnecting line 16 and the interconnecting line 17a cross each other at the first metallization level, which causes a short circuit. Consequently, in this case, the input protecting circuit region 13a and input wiring regions 15a and 15b cannot be utilized and remains wasteful. In other words, the efficiency in utilizing the I/O cells is poor.

As illustrated, the pad 12d is connected to the input protecting circuit region 13d and the output circuit regions 14c and 14d by an interconnecting line 18. The input protecting circuit region 13d is connected to an interconnecting line 19 passed through the input wiring region 15d. These interconnections make a bidirectional output buffer, and the pad 12d is used as an input/output terminal of the bidirectional signal transmissions. However these interconnections also make it impossible to utilize pad 12d, the input protecting circuit region 13c and the input wiring region 15c. This is because an interconnecting line 17b shown by a two-dotted chain line extending from the input protecting circuit region 13c and the interconnecting line 18 cross each other at the first metallization level. Hence, the efficiency in utilizing the I/O cells 11a to 11d in this case is also poor.

Moreover, the fact that it is impossible to take the routing of the interconnecting line 17b means that the degree of flexibility of the design by the user is degraded For example, the use of the pad 12c for the terminal for the bidirectional signal transfer in place of the pad 12d is not allowed. This is because in this case, the input line extending from the input protecting circuit region 13c crosses the interconnecting line 18 at the first metallization level.

The present invention generally intends to eliminate the above disadvantages of the conventional master slice type integrated circuit.

A description will be given on an embodiment of a master slice type integrated circuit according to the present invention with reference to FIGS. 2, 3, 4A and 4B.

Figure 2:
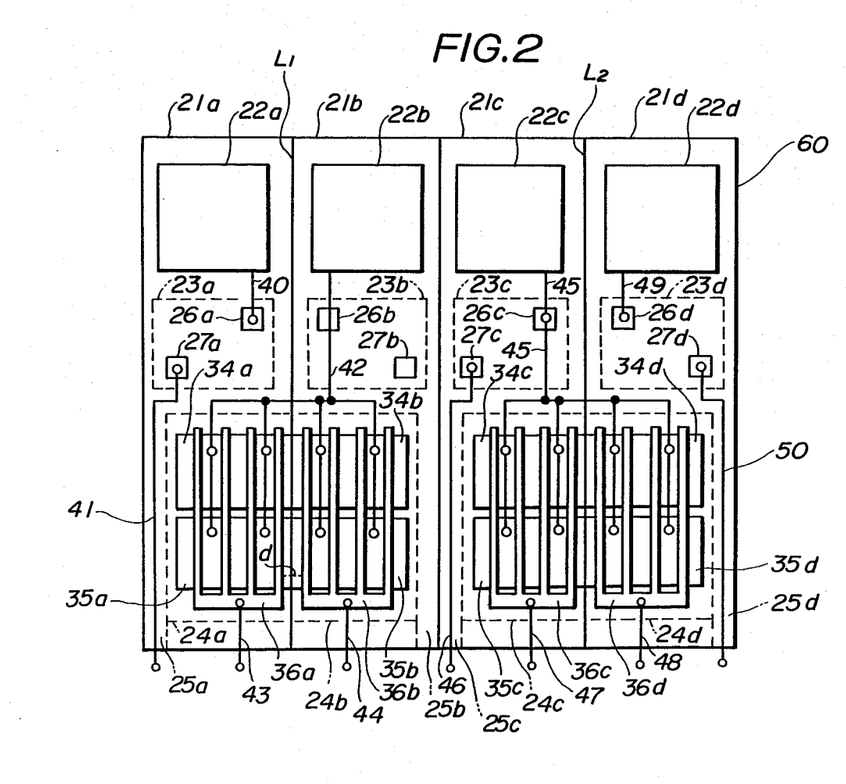
FIG. 2 is a plan view of essential parts of input/output cells of an example of a master slice type integrated circuit according to the present invention.

Referring to FIG. 2, I/O cells 21a to 21d are aligned in a peripheral region of a chip 60 of a master slice type integrated circuit. The I/O cells 21a to 21d comprise pads 22a to 22d, input protecting circuit regions 23a to 23d, output circuit regions 24a to 24d, and input wiring regions 25a to 25d. The input protecting circuit region and input wiring region form an input circuit region. The input protecting circuit regions 23a to 23d are used to form protecting circuits for preventing input buffers (not shown) constituted by combination of basic cells from being damaged because of the electrostatic discharge. The output circuit regions 24a to 24d are used to constitute output buffers. The input wiring regions 25a to 25d are used to pass input interconnections extending from the input protecting circuit regions 23a to 23d towards the input buffers.

The I/O cells 21a and 21c have the same configuration. The input wiring regions 25a and 25c are located on the left-hand sides of the I/O cells 21a and 21c, respectively. The input protecting circuit regions 23a and 23c have, on the right-hand sides thereof, input terminals 26a and 26c for connections with the pads 22a and 22c, respectively. In addition, the input protecting circuit regions 23a and 23c have, on the left-hand sides thereof, have output terminals 27a and 7cfor connections with the input buffers by interconnecting lines passed through the input wiring regions 25a and 25c, respectively. Further, the terminals 26a and 27a; and 226b and 27b are arranged diagonally.

The I/O cells 21b and 21d have the same configuration. The input wiring regions 25b and 25d are located on the right-hand sides of the I/O cells 21b and 21d, respectively. The input protecting circuit regions 23b and 23d have input terminals 26b and 26d for connections with the pads 22b and 22d on the left-hand sides thereof. In addition, the input protecting circuit regions 23b and 23d have, on the right-hand sides thereof, output terminals 27b and 27d for connections with the input buffers by interconnecting lines passed through the input wiring regions 25b and 25d, respectively.

The adjacent two I/O cells 21a and 21b form a pair. Likewise, the adjacent two I/O cells 21c and 21d form a pair. The output circuit regions 24a and 24b of the I/O cells 21a and 21b are located close to each other. That is, the output circuit regions 24a and 24b of the pair of the I/O cells 21a and 21b are arranged in the vicinity of an imaginary boundary $L_1$ of the pair. The input wiring regions 25a and 25b of the pair of the I/O cells 21a and 21b are arranged in the vicinity of boundaries with respect to other pairs. In the illustrated layout, the I/O cells 21a and 21b have a reflection relationship in which the input wiring regions 25a and 25b as well as the output circuit regions 24a and 24b are symmetrically located with respect to the boundary line $L_1$ of the I/O cells 21a and 21b. It may be said that the output circuit regions 24a and 24b are interposed between the input wiring regions 25a and 25b. Similarly, the I/O cells 21c and 21d are paired with each other and have the reflection relationship with respect to an imaginary boundary line $L_2$. It should be noted that although the terminals 26a and 26b; and 27a and 27b respectively have the reflection relationship, this relationship is not necessary to form the master slice type integrated circuit according to the present invention. In other words, locations of these terminals may be arbitrarily selected. Of course, locations of the terminals 26c and 26d; 27c and 27d may be arbitrarily selected. An important consideration in forming the master slice type integrated circuit according to the present invention is that the output circuit regions 24a and 24b of the pair of the I/O cells 21a and 21b are arranged in the vicinity of a boundary line $L_1$, and that the input wiring regions 25a and 25b are arranged in the vicinity of the boundary lines with respect to other pairs.

Figure 3:
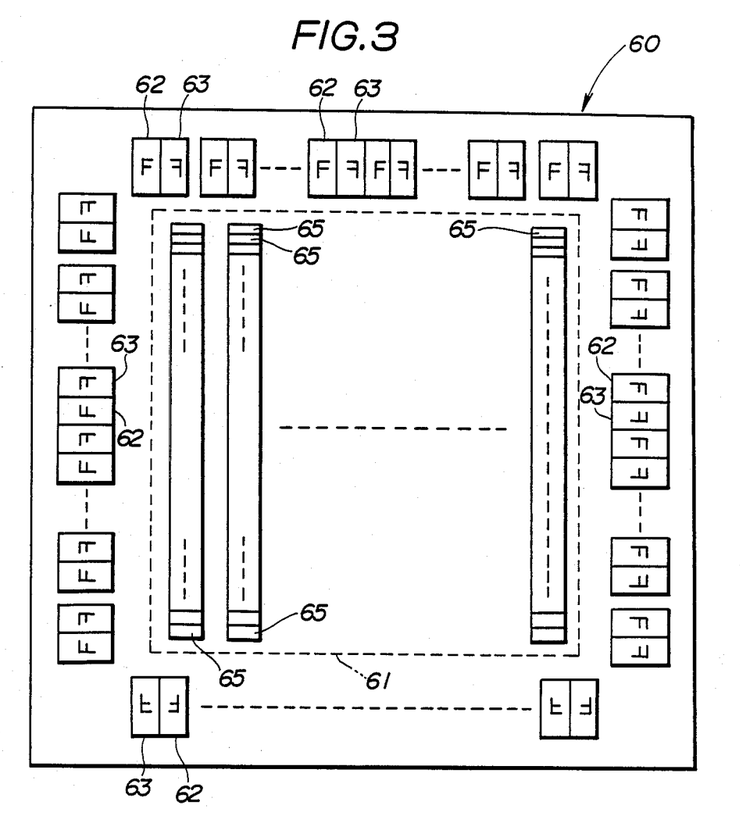
FIG. 3 is a plan view of an example of a structure according to the present invention.

FIG. 3 is a plan view showing a whole of the master slice type integrated circuit of the embodiment. A plurality of basic cells 65 are arrayed like a matrix in a central region surrounded by a broken line on the semiconductor chip 60. Outside the central region, i.e., in the peripheral region of the chip, there are aligned a plurality of I/O cells 62 and 63. I/O cells 62 each designated by a character "F" are cells having the same configuration as that of the I/O cells 21a and 21c shown in FIG. 2. I/O cells 63 each designated by a symbol "ᖴ" are cells having the same configuration as that of I/O cells 21b and 21d. That is, adjacent I/O cells 62 and 63 are paired. Adjacent pairs of I/O cells may be close to each other or spaced a predetermined distance. For example, pairs of I/O cells located in the vicinity of corners of the chip 60 are held away from each other, whereas pairs of I/O cells located in the intermediate portions are close to each other. This depends on the concept of design of the device.

Figure 4A:
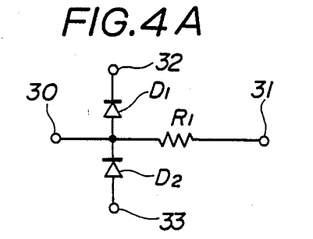
FIG. 4A is a circuit diagram of an input protecting circuit which can be used in the structure shown in FIG. 2.

FIG. 4A shows an input protecting circuit which may be formed on each of the input protecting circuit regions 23a to 23d. An input terminal 30 of the circuit corresponds to the terminals 26a to 26d, and an output terminal 31 corresponds to the terminals 27a to 27d. The terminal 30 is connected to an anode of a diode D1 and a cathode of a diode D2. The terminal 30 is also connected to the output terminal 31 through a resistor $R_1$. A cathode of the diode D1 is connected to a positive power supply terminal 32, and an anode of the diode D2 is connected to a negative power supply terminal 33.

Figure 4B:
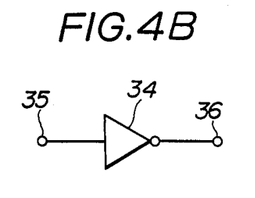
FIG. 4B is a circuit diagram of an output buffer which can be used in the structure shown in FIG. 2.

The output circuit regions 24a to 24d comprise regions 34a to 34d for forming n-channel metal oxide semiconductor (hereafter simply referred to as MOS) transistors and regions 35a to 35d for forming p-channel MOS transistors. The regions 24a to 24d comprises n+-doped diffusion layers formed in the p-type silicon crystal of the chip 20, and the regions 25a to 25d are p+-doped diffusion layers formed in an n-type well layer formed in the p-silicon substrate. Gates 36a to 36d are provided over the n-channel MOS transistor regions 34a to 34d and the p-channel MOS transistor regions 35a to 35d, as shown in FIG. 2. Therefore, the output buffer in each of the I/O cells 21a through 21d is made by one or more complementary MOS inverters CMOS inverters). An equivalent circuit of the output buffer is shown in FIG. 4B. In the illustrated configuration, the output buffer consists of a plurality of CMOS inverters connected in parallel to increase the driving capability. In FIG. 4B, a terminal 35 corresponds to the gates 36a to 36d, and a terminal 36 corresponds to the drains of the n-channel MOS transistor regions 34a to 34d and the p-channel MOS transistor regions 35a to 35d. At the drains, ohmic contacts between the interconnection lines of the first metallization layer and each of n- and p-channel MOS transistor regions 24a and 24b are formed. The ohmic contacts are represented by circles in FIG. 2.

Preferably, the gates 36a and 36b of the pair of I/O cells 21a and 21b are symmetrically formed with respect to each other as shown in FIG. 2. Likewise, the gates 36c and 36d of the pair of I/O cells 21c and 21d are also symmetrically formed.

The pad 22a is connected to the input terminal 26a of the input protecting circuit region 23a by an interconnecting line 40. The output terminal 27a of the input protecting circuit regions 27a is connected to basic cells (not shown) by an interconnecting line 41 passed through the input wiring region 25a.

The pad 22b is connected to the drains of the n-channel MOS transistor regions 34a and 34b and the output circuit regions 24a and 24b. The gates 36a and 36b are connected to basic cells by interconnecting lines 43 and 44, respectively. The above interconnections make an output buffer having a driving capability twice that of an output buffer constituted by a single output circuit is used for outputting a signal to an external circuit (not shown).

The pad 22c of the I/O cell 21c is connected by an interconnecting line 45 to the input terminal 26c of the input protecting circuit 24c and the drains of n-channel MOS transistor regions 34c and 34d as well as p-channel MOS transistor regions 35c and 35d of the output circuit regions 24a and 24d. The output terminal 27c of the input protecting circuit region 23c is connected to basic cells by an interconnecting line 46 passed through the input wiring regions 25c. The gates 36c and 36d are connected to basic cells by interconnecting lines 47 and 48, respectively. The above interconnections make an output buffer having a driving capability twice that of an output buffer constituted by a single output circuit region 24c or 24d. The pad 22c is used for transmitting the signals in the bidirection.

The pad 22d is connected to the input terminal 26d of the input protecting circuit region 23d by an interconnecting line 49. The output terminal 27d of the input protecting circuit region 23d is connected to basic cells by an interconnecting line 50 passed through the input wiring region 25d.

As described above, because the I/O cells 22a and 22b (22c and 22d) having the reflection relationship are paired, it becomes possible to utilize all of the I/O cells 21a to 21d as well as all of the pads 22a to 22d. It should be appreciated that out of the elements which cannot be utilized in the structure shown in FIG. 1, only the input wiring region 25b remains unused in the structure of FIG. 2 according to the present invention.

In the structure of FIG. 2, it is possible to use the pad 22a to receive an input signal in place of the pad 22b. It is also possible to interchange the pad 22c with the pad 22d so that the pad 22d can be used for the input/output of the bidirectional transmission, and the pad 22c can be used for receiving the input signal. Consequently, it may be said that the degree of flexibility in the design of the device by the user is enhanced.

In addition, when passing the interconnection lines through the input wiring regions, it is necessary to hold the interconnecting lines away from the output circuit regions, particularly the output circuit regions of other I/O cells by a predetermined distance. As shown in FIG. 2, the input wiring regions 25a to 25d of the embodiment are held away from the output circuit regions of other I/O cells, as compared to the configuration shown in FIG. 1. For example, the interconnecting line 46 of the I/O cell 21c is held away from the output circuit regions 24b of the I/O cell 21b through the input wiring region 25b.

Moreover, areas next to the n-channel MOS transistor regions 34a and 34b are source regions. For this reason, it is possible to diminish the width d of the source region, compared to the conventional integrated circuit. This also holds true for sources next to the p-channel MOS transistor regions 35a, 35b, 35c and 35d. Hence, the integration density can be enhanced according to the present invention.

The present invention is not limited to the embodiments described above, but various variations and modifications may be made without departing from the scope of the present invention.

What is claimed is:

1. A master slice type integrated circuit for providing various circuits by altering the routing of interconnections comprising:
    a plurality of input/output cells arranged in a peripheral region on a semiconductor chip, the input/output cells each comprising pads for connection with an external circuit, input wiring regions each for accommodating input interconnecting lines carrying input signals, and output circuit regions each for forming output buffers; and
    a plurality of basic cells being arranged in a region on the chip surrounded by the arrangement of the input/output cells,
    wherein two adjacent input/output cells are paired with each other, the output circuit regions of the pair of the input/output cells are arranged in the vicinity of a boundary of the pair, and the input wiring regions of the pair are arranged in the vicinity of boundaries with respect to other pairs.

2. A master slice type integrated circuit as claimed in claim 1, wherein the pair of the input/output cells has a reflection relationship in which the output circuit regions and the input wiring regions of the pair are symmetrically located opposite each other with respect to the boundary.

3. A master slice type integrated circuit as claimed in claim 1, wherein each of the output circuit regions includes a region for forming an n-channel metal oxide semiconductor transistor and a region for forming a p-channel metal oxide semiconductor region.

4. A master slice type integrated circuit as claimed in claim 3, wherein the n-channel and p-channel metal oxide semiconductor regions of the pair of input/output cells are close to each other through respective source regions.

5. A master slice type integrated circuit as claimed in claim 1, wherein an interconnection line for transmitting a signal is formed by a first metallization layer and a power supply line for supplying a power to circuits constituted in the chip is formed by a second metallization layer.

6. A master slice type integrated circuit as claimed in claim 1, wherein adjacent pairs of input/output cells are close to each other.

7. A master slice type integrated circuit as claimed in claim 1, wherein adjacent pairs of input/output cells are spaced a predetermined distance.

8. A master slice type integrated circuit as claimed in claim 1, wherein each of the input/output cells of the master slice type integrated circuit further comprises an input protecting circuit region for forming a protection circuit which has a function of protecting an input buffer composed of the basic cells against an electrostatic discharge.

9. A master slice type integrated circuit as claimed in claim 8, wherein the pair of input/output cells comprises a first interconnection line extending from the pad of one input/output cell of the pair to the input buffer through the input protecting circuit region and the input wiring region, and a second interconnection line which connects the pad of the other input/output cell of the pair to the n- and p-channel MOS transistor regions of the pair of input/output cells.

10. A master slice type integrated circuit as claimed in claim 8, wherein the pair of input/output cells comprises a first interconnecting line which connects the pad of one input/output cell of the pair to the input buffer through the input protecting region and the input wiring region, and a second interconnecting line which couples the pad of said one input/output cell of the pair to the n- and p-channel MOS transistor regions of the pair.

11. A master slice type integrated circuit as claimed in claim 3, wherein the output buffer is an inverter composed of the pair of n- and p-channel metal oxide semiconductor transistors.

12. A master slice type integrated circuit as claimed in claim 3, wherein the output buffer is made up of inverters connected in parallel, each of which is composed of the pair of n- and p-channel metal oxide semiconductor transistors.

13. A master slice type integrated circuit as claimed in claim 1, wherein the input protecting circuit region comprises an input terminal, a first diode having a cathode connected to a positive power supply terminal and an anode connected to the input terminal, a second diode having a cathode connected to the input terminal and an anode connected to a negative power supply terminal, a resistor having an end connected to the input terminal, and an output terminal connected to the other end of the resistor.

* * * * *

UNITED STATES PATENT AND TRADEMARK OFFICE
CERTIFICATE OF CORRECTION

PATENT NO. : 4,825,107
DATED : April 25, 1989
INVENTOR(S) : Masayuki NAGANUMA et al.

It is certified that error appears in the above-identified patent and that said Letters Patent is hereby corrected as shown below:

Col. 3, line 34, delete "25".

Col. 4, line 6, after "graded" insert --.--;

line 43, delete "have";

line 43, change "7cfor" to --27c for--.

line 47, change "226b" to --26b--.

Col. 5, line 68, change "CMOS" to --(CMOS--.

Col. 6, line 31, after "circuit" insert --region 24a or 24b. The pad 22b--;

line 34, change "22cof" to --22c of--.

Signed and Sealed this

Tenth Day of October, 1989

*Attest:*

DONALD J. QUIGG

*Attesting Officer*      *Commissioner of Patents and Trademarks*

REEXAMINATION CERTIFICATE (1772nd)
United States Patent [19]
Naganuma et al.

[11] B1 4,825,107
[45] Certificate Issued  Aug. 18, 1992

[54] MASTER SLICE TYPE INTEGRATED CIRCUIT

[75] Inventors: Masayuki Naganuma; Yoshiyuki Suehiro, both of Kawasaki, Japan

[73] Assignee: Fujitsu Limited

Reexamination Request:
No. 90/002,571, Feb. 14, 1992

Reexamination Certificate for:
Patent No.: 4,825,107
Issued: Apr. 25, 1989
Appl. No.: 155,574
Filed: Feb. 12, 1988

[30] Foreign Application Priority Data
Feb. 13, 1987 [JP] Japan .................. 62-31782

[51] Int. Cl.[5] .................. H03K 3/01; H03K 19/01
[52] U.S. Cl. .................. 307/465; 307/303.1; 357/45; 364/491; 364/716
[58] Field of Search .................. 307/465, 465.1, 475, 307/482.1, 303.1; 357/45

[56] References Cited
U.S. PATENT DOCUMENTS

4,766,475 8/1988 Kawashima .................. 357/40
4,868,630 9/1989 Tanizawa et al. .................. 357/45

FOREIGN PATENT DOCUMENTS
60-95935 5/1985 Japan .
2143990 2/1985 United Kingdom .

OTHER PUBLICATIONS
Patent Abstracts of Japan, vol. 9, No. 244 (E-346) (1967) Sep. 30, 1985 & JP-A-60 095935.
Electronic Design, vol. 30, No. 25, Dec. 1982, Waseca, Minn., Denville, N.J., USA; "Automation advances for CMOS gate-array design", pp. 155-162.

*Primary Examiner*—John S. Heyman

[57] ABSTRACT

A master slice type integrated circuit for providing various circuits by altering the routing of interconnections comprises a plurality of input/output cells arranged in a peripheral region on a semiconductor chip, the input/output cells each comprising pads for connection with an external circuit, input wiring regions each for accommodating input interconnecting lines transmitting input signals applied to the pads, and output circuit regions each for forming output buffers; and a plurality of basic cells being arranged in a region on the chip surrounded by the arrangement of the input/output cells. Two adjacent input/output cells are paired with each other. The output circuit regions of the pair of the input/output cells are arranged in the vicinity of a boundary of the pair. The input wiring regions of the pair are arranged in the vicinity of boundaries with respect to other pairs.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-13 is confirmed.

* * * * *